United States Patent
Radosavljevic et al.

(10) Patent No.: US 8,344,425 B2
(45) Date of Patent: Jan. 1, 2013

(54) MULTI-GATE III-V QUANTUM WELL STRUCTURES

(75) Inventors: Marko Radosavljevic, Beaverton, OR (US); Uday Shah, Portland, OR (US); Gilbert Dewey, Hillsboro, OR (US); Niloy Mukherjee, Beaverton, OR (US); Robert S. Chau, Beaverton, OR (US); Jack Kavalieros, Portland, OR (US); Ravi Pillarisetty, Portland, OR (US); Titash Rakshit, Hillsboro, OR (US); Matthew V. Metz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 211 days.

(21) Appl. No.: 12/655,463

(22) Filed: Dec. 30, 2009

(65) Prior Publication Data

US 2011/0156004 A1    Jun. 30, 2011

(51) Int. Cl.
*H01L 29/12* (2006.01)
*H01L 21/20* (2006.01)
*H01L 21/336* (2006.01)
*H01L 21/18* (2006.01)

(52) U.S. Cl. ......... 257/200; 257/E29.069; 257/E21.441; 438/285

(58) Field of Classification Search .................. None
See application file for complete search history.

(56) References Cited

U.S. PATENT DOCUMENTS

| | | | |
|---|---|---|---|
| 6,888,181 B1 | 5/2005 | Liao et al. | |
| 7,005,330 B2 | 2/2006 | Yeo et al. | |
| 7,176,092 B2 * | 2/2007 | Yeo et al. | 438/283 |
| 7,842,559 B2 * | 11/2010 | Jakschik et al. | 438/150 |
| 2004/0145000 A1 | 7/2004 | An et al. | |
| 2005/0184316 A1 * | 8/2005 | Kim et al. | 257/213 |
| 2006/0292765 A1 * | 12/2006 | Blanchard et al. | 438/157 |
| 2007/0218628 A1 * | 9/2007 | Orlowski et al. | 438/254 |
| 2007/0235818 A1 * | 10/2007 | Anderson et al. | 257/401 |
| 2008/0070366 A1 | 3/2008 | Doris et al. | |
| 2008/0265280 A1 * | 10/2008 | Currie | 257/190 |
| 2009/0007036 A1 * | 1/2009 | Cheng et al. | 716/5 |
| 2009/0176353 A1 * | 7/2009 | Plummer et al. | 438/481 |
| 2009/0200616 A1 | 8/2009 | Shimizu et al. | |
| 2009/0280626 A1 * | 11/2009 | Zhu et al. | 438/479 |
| 2009/0294800 A1 * | 12/2009 | Cheng et al. | 257/192 |
| 2011/0068375 A1 * | 3/2011 | Jakschik et al. | 257/255 |

FOREIGN PATENT DOCUMENTS

WO    2011/090577 A2    7/2011

(Continued)

OTHER PUBLICATIONS

Parillaud, O., E. Gil-Lafon, B. Gel• rard, P. Etienne, and D. Pribat. "High Quality InP on Si by Conformal Growth." Applied Physics Letters 68.19 (1996): 2654.*

(Continued)

*Primary Examiner* — Thomas L Dickey
*Assistant Examiner* — Joseph Schoenholtz
(74) *Attorney, Agent, or Firm* — Forefront IP Lawgroup, PLLC (57) ABSTRACT

Methods of forming microelectronic structures are described. Embodiments of those methods include forming a III-V tri-gate fin on a substrate, forming a cladding material around the III-V tri-gate fin, and forming a hi k gate dielectric around the cladding material.

6 Claims, 12 Drawing Sheets

FOREIGN PATENT DOCUMENTS

WO 2011/090577 A3 2/2012

OTHER PUBLICATIONS

International Search Report and Written Opinion received for PCT Patent Application No. PCT/US2010/059395, mailed on Dec. 19, 2011, 11 pages.

J.P. Colinge, "Multi-gate SOI MOSFETs", Microelectronics Engineering, 84, 2007, pp. 2071-2076.

International Preliminary Report on Patentability and Written Opinion received for PCT Patent Application No. PCT/US2010/059395, mailed on Jul. 12, 2012, 8 pages.

* cited by examiner

| 610 |
| 600 |

FIG. 6b

| 600' |
| 610 |
| 600 |

MULTI-GATE III-V QUANTUM WELL STRUCTURES

A variety of electronic and optoelectronic devices use thin film relaxed lattice constant III-V semiconductors on semiconductive substrates such as elemental silicon (Si) substrates. Surface layers capable of using the properties of III-V materials may host a variety of high performance electronic devices such as complementary metal oxide semiconductor (CMOS) and quantum well (QW) transistors.

BRIEF DESCRIPTION OF THE DRAWINGS

While the specification concludes with claims particularly pointing out and distinctly claiming certain embodiments, the advantages of the various embodiments can be more readily ascertained from the following description of the embodiments when read in conjunction with the accompanying drawings in which:

DETAILED DESCRIPTION

In the following detailed description, reference is made to the accompanying drawings that show, by way of illustration, the specific embodiments which may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from their spirit and scope. In addition, it is to be understood that the location or arrangement of individual elements within each disclosed embodiment may be modified without departing from their spirit and scope. The following detailed description is, therefore, not to be taken in a limiting sense, and the scope of the embodiments is defined only by the appended claims, appropriately interpreted, along with the full range of equivalents to which the claims are entitled. In the drawings, like numerals refer to the same or similar functionality throughout the several views.

Methods and associated structures of forming and utilizing microelectronic structures, such as quantum well structures, are described. Those methods and structures may include forming a III-V tri-gate fin on a substrate, forming a cladding layer around the III-V tri-gate fin, and forming a hi k gate dielectric around the cladding layer. Various embodiments included herein enable growth of a cladding layer around III-V fins to enable III-V tri-gate devices with high k dielectrics.

Figure 1A:
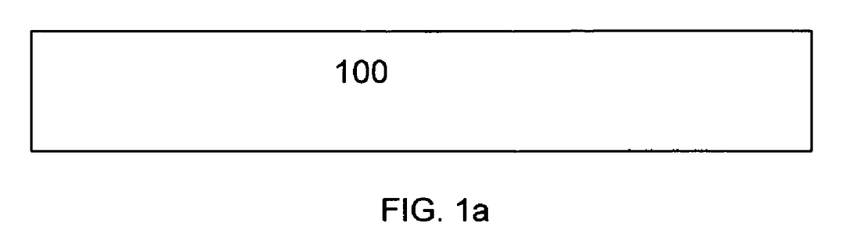
FIGS. 1a-1g represent methods of forming structures according to an embodiment.
Figure 1B:
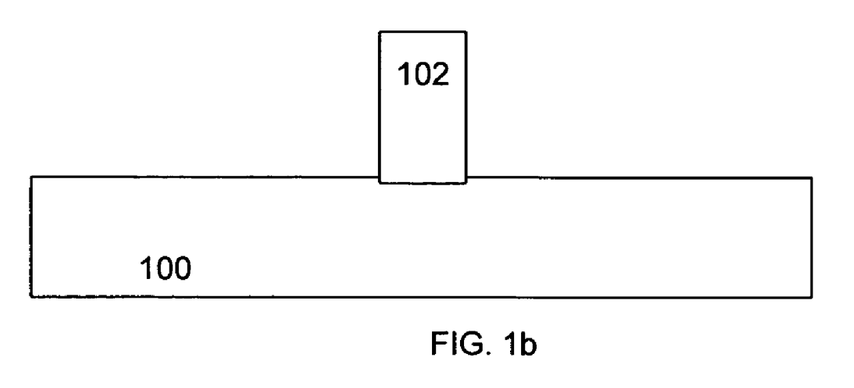

FIGS. 1a-1g illustrate embodiments of forming microelectronic structures, such as forming quantum well structures, for example. FIG. 1a illustrates a substrate 100. In one embodiment, the substrate 100 may comprise a silicon on insulator substrate (SOI) 100, but may also include any type of suitable substrate material. A fin 102 may be formed on the substrate 100. The fin may comprise III-V materials, such as but not limited to InGaAs, InAs, and InSb (FIG. 1b). The fin 102 may comprise a portion of a frigate transistor, and may comprise a tri-gate fin 102.

Figure 1C:
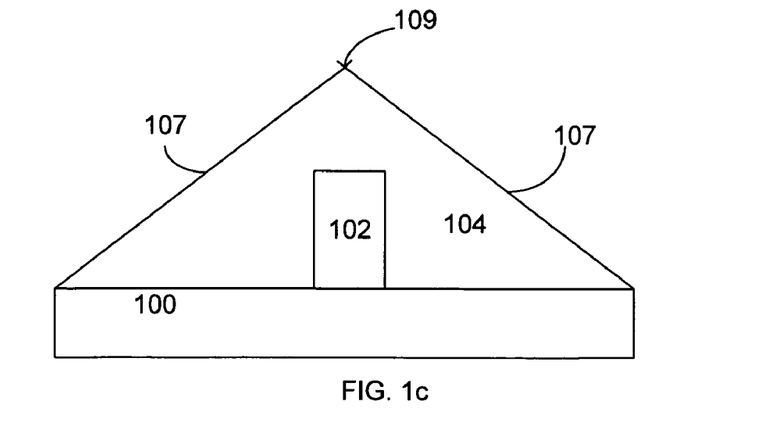
Figure 1D:
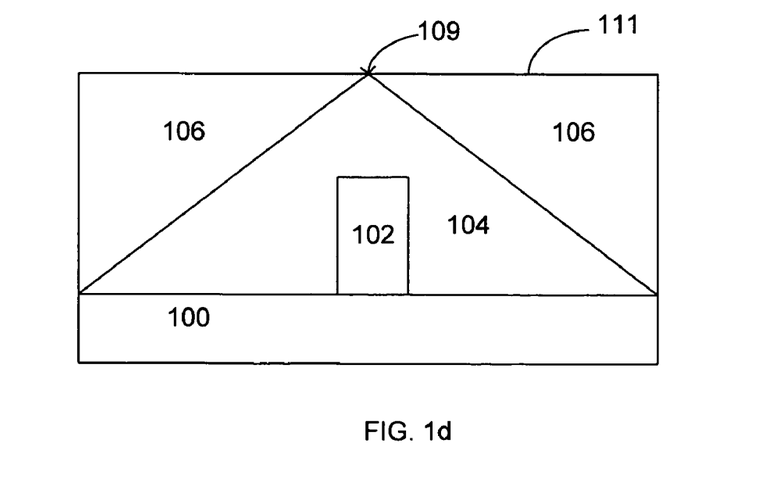

A cladding material 104, which may comprise such materials as InP, AlInAs, AlInSb, for example, may be formed around the fin 102 (FIG. 1c). The cladding material 104 may comprise any suitable III-V material in some embodiments. The cladding material 104 may be formed by using an epitaxial technique, such as molecular beam epitaxy (MBE) or molecular orbital vapor phase epitaxy (MOVPE), or other conformal techniques such as atomic layer deposition (ALD), chemical vapor deposition (CVD), sputtering, etc. In an embodiment, the cladding material 104 may form along specific crystalline planes, which may result in a triangular shape of the cladding material 104. The triangular cladding material 104 may comprise side portions 107 and a tip 109. In an embodiment, the cladding material 104 may undergo a dielectric formation process 105 (FIG. 1d), wherein a dielectric material 106, such as but not limited to an oxide, may be formed/grown on the cladding material 104, such as by an oxidation, chemical vapor deposition process 105, for example. The dielectric material 106 may form on the sides 107 of the triangular shaped cladding material 104, such that a top surface 111 of the dielectric material 106 may be coplanar with the tip 109 of the triangular cladding material 104.

Figure 1E:
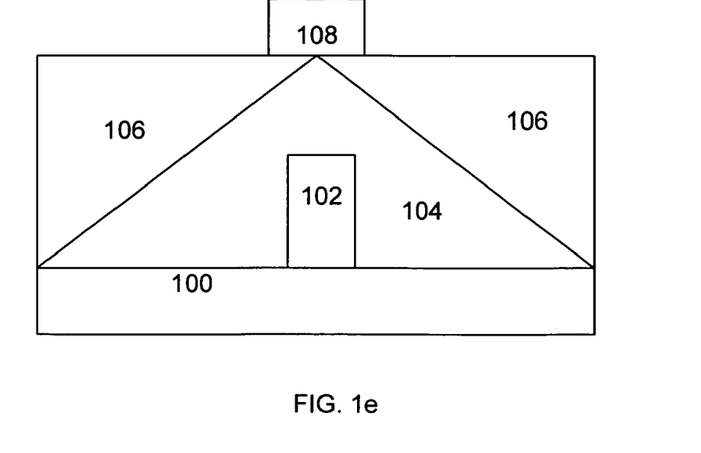
Figure 1F:
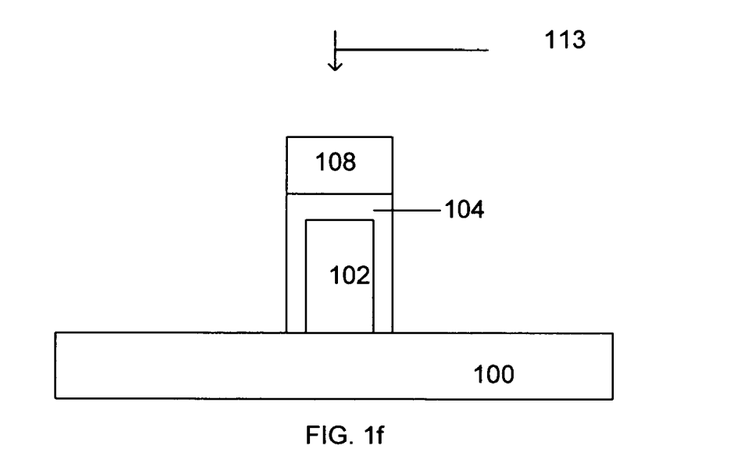
Figure 1G:
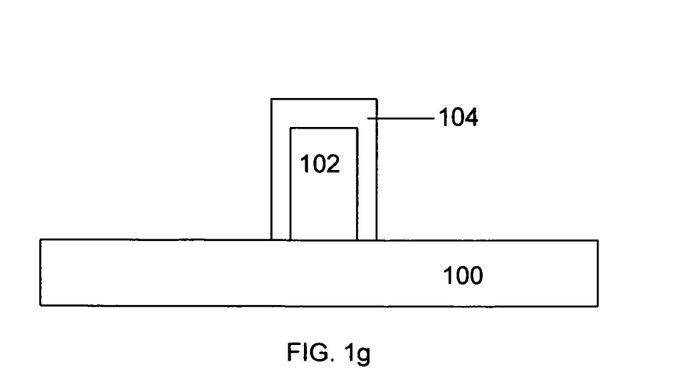

In an embodiment, a resist material 108 may be formed on/over the tip 109 of the cladding material 104, as well as over the fin 102 (FIG. 1e). In an embodiment, a removal process 113, such as a dielectric etching process and/or a chemical mechanical processing for example, may be performed in which the dielectric material 106 and a portion of the cladding material not covered by the resist material 108 may be removed (FIG. 10. A rectangular portion of the cladding material 104 surrounds the fin 102 after the removal process 113. The resist material 108 may then removed, wherein the rectangular portion of the cladding material 104 is exposed (FIG. 1g).

Thus the triangular cladding material 104 may undergo a series of dielectric formation and removal processes to form a more useful structure for the fin 102 of a quantum well tri-gate (non-planar) transistor structure, for example. In an embodiment, due to tri-gate architecture, the cladding material 104 physical thickness (and whole Toxe) can be relaxed as compared to that in a planar device, while maintaining the same electrostatic integrity due to the three-dimensional nature of the tri-gate device. A hi k dielectric may be subsequently grown on the cladding material, in some embodiments.

Figure 2A:
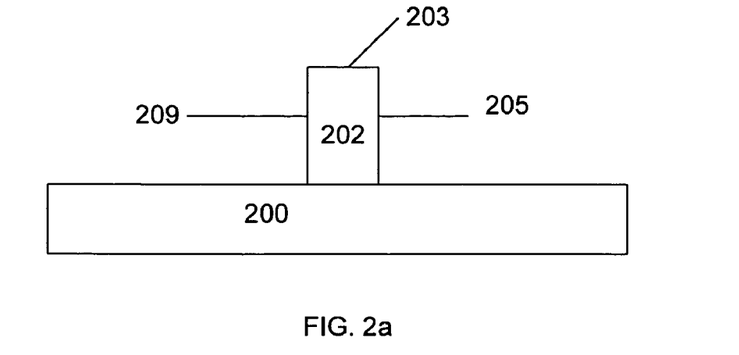
FIGS. 2a-2c represent methods of forming structures according to an embodiment.
Figure 2B:
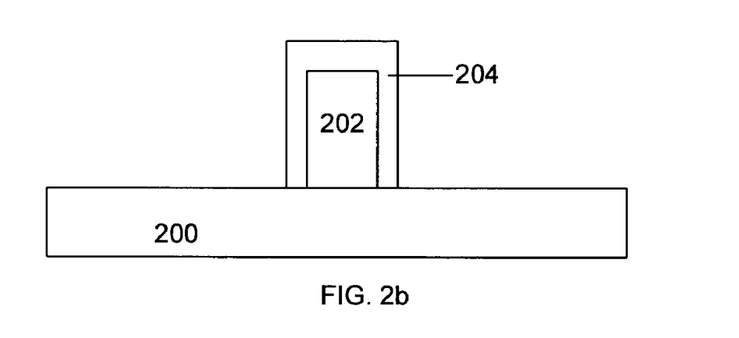
Figure 2C:
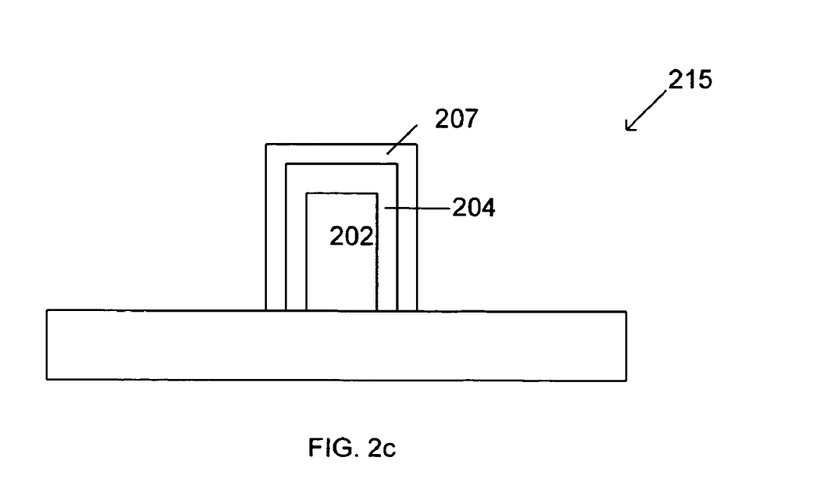

In another embodiment, a trigate fin 202 may be disposed on a substrate 200 (similar to the fin 100 and substrate 100 of FIG. 1b, for example) (FIG. 2a). The trigate fin 202 may comprise a tri-gate channel of a trigate device, (wherein the tri-gate fin 202 comprises a top gate 203 and two side gates 205, 209) in an embodiment. A cladding material 204 may be formed on a top surface and on the sides of the fin/channel 202 (FIG. 2b). In an embodiment, the cladding material 204 may be formed according to a process similar to the processes depicted in FIGS. 1a-1g) disclosed previously herein. The cladding material 204 may comprise any suitable III-V cladding material, in some embodiments. In an embodiment, the cladding material comprises a conformal cladding material layer around the tri-gate fin 202. A high k dielectric 207 (comprising a dielectric constant greater than about 4.0) may be formed on the cladding material 204 to form a tri-gate structure 215, and may comprise a high k gate dielectric 207 disposed on the tri-gate fin 202 (FIG. 2c). In an embodiment, the tri-gate structure 215 may further comprise a gate material and source/drain regions, similar to the trigate structure 315 of FIG. 3c, for example.

In an embodiment, the trigate structure 215 may comprise a portion of a III-V tri-gate quantum well device suitable for ultimate scalability of gate length and off-state leakage while simultaneously preserving high mobility and high speed of the III-V quantum well device. The high k dielectric 207 formed on the cladding material 204 may preserve high mobility of the tri-gate channel and may enable high speed of the tri-gate quantum well device. The III-V trigate quantum well architecture enables scaling (both Ioff control and pitch/density scaling) and further enables high performance (high mobility) devices. The tri-gate structure 215 may be further optimized by combining re-growth for Rext (important in narrow fins), modulation halo (opposite sign dopants to further control Ioff) and multiple fin channels.

Figure 3A:
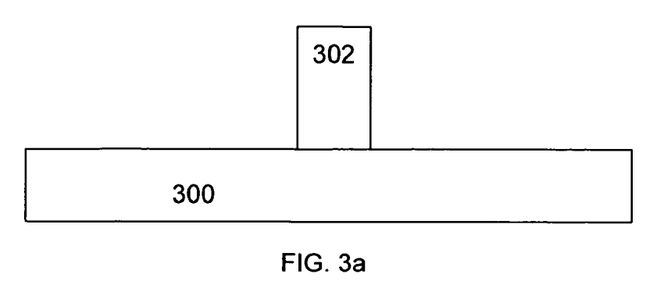
FIGS. 3a-3c represent methods of forming structures according to an embodiment.
Figure 3B:
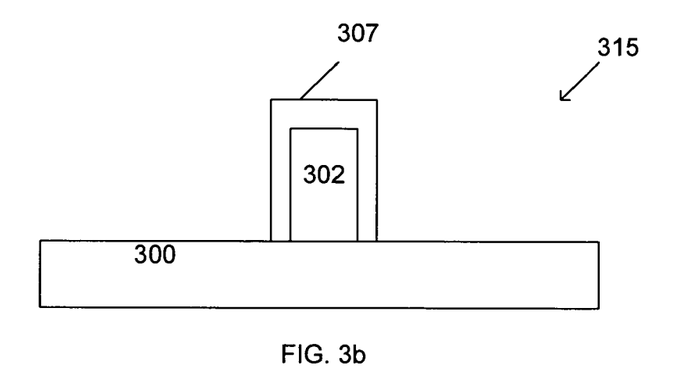
Figure 3C:
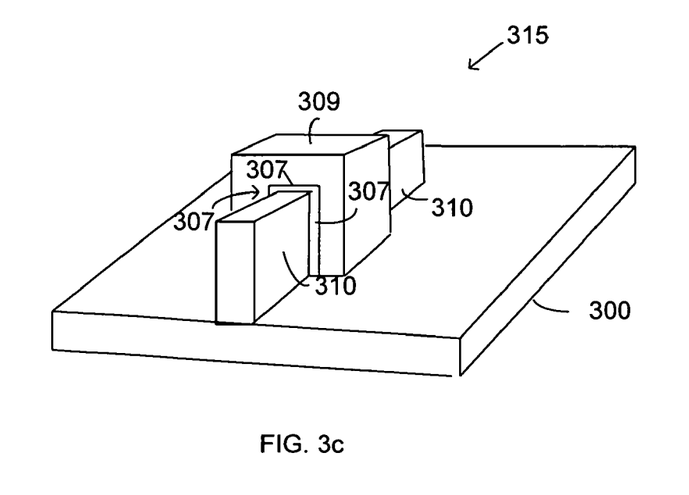

In another embodiment, a trigate fin 302 may be disposed on a substrate 300 (similar to the fin 202 and substrate 200 of FIG. 2a, for example) (FIG. 3a). The tri-gate fin 302 may comprise three sides. The tri-gate fin 302 may comprise a channel of a tri-gate device, in an embodiment. A high k dielectric 307 may be formed directly on the three sides of the tri-gate fin 302, to form a tri-gate structure 315, and may comprise a high k gate dielectric 307 disposed on the tri-gate channel 302 (FIG. 3b). In an embodiment, the trigate structure 315 may comprise a portion of a III-V tri-gate quantum well device. FIG. 3c depicts an embodiment wherein a gate material 309 is formed on the three gate dielectric layers 307 around the three sides of the trigate fin 302, and source/drain regions 310 are disposed adjacent the gate material 309. In an embodiment, the high-k dielectric 307 formed directly on the channel 302 may improve for effective oxide thickness (EOT) scaling. The EOT may be reduced, and the short channel effect improved resulting in ability to further reduce gate length of the device and increase the density of the transistors packed on the chip and the microprocessor complexity and functionality. The high k dielectric 307 may be formed by an atomic level deposition (ALD) process in some cases.

Figure 4A:
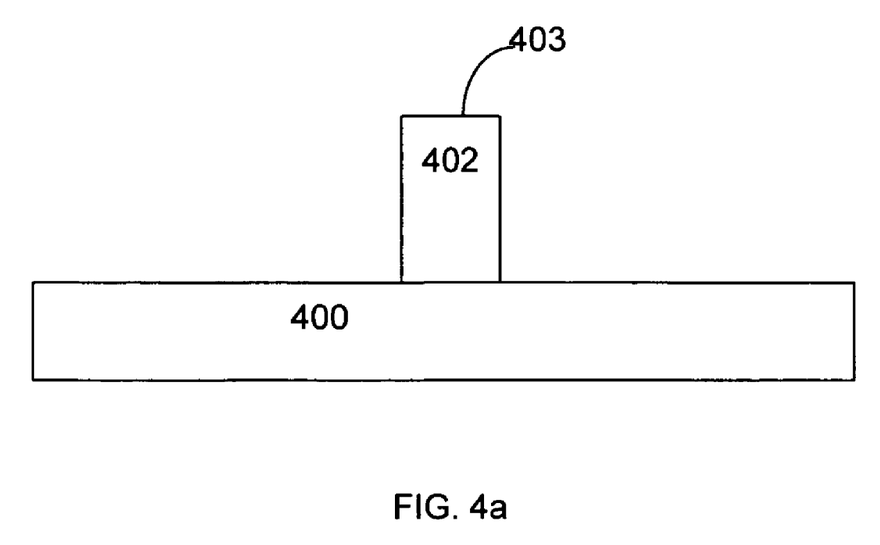
FIGS. 4a-4d represent methods of forming structures according to an embodiment.
Figure 4B:
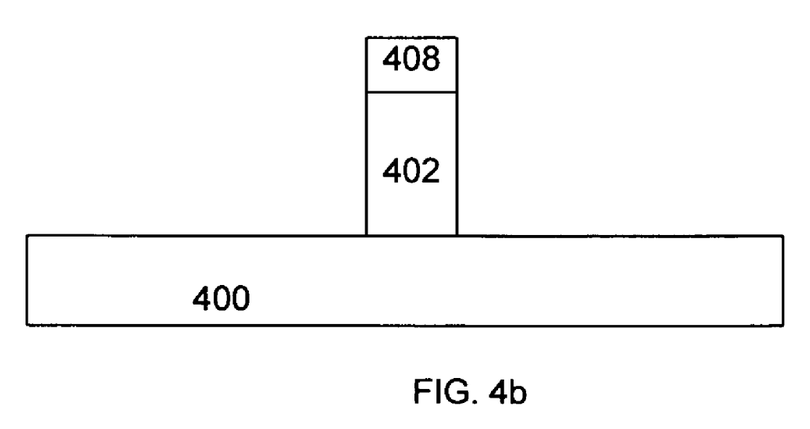
Figure 4C:
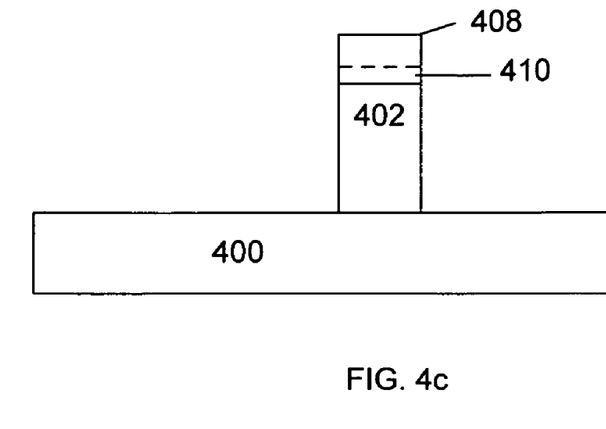

In another embodiment, a trigate fin 402 may be disposed on a substrate 400 (similar to the fin 202 and substrate 200 of FIG. 2a, for example) (FIG. 4a). The trigate fin 402 may comprise a tri-gate channel of a trigate quantum well device, in an embodiment, and may comprise a top surface 403. A top barrier material 408 may be formed on the top surface 403 of the tri-gate fin 402 (FIG. 4b). The top barrier material 408 may comprise AlInAs, AlInSb, AlGaAs and InP. A portion 410 of the top barrier material 408 may be delta doped, wherein a monolayer of dopant atoms such as Si, S or Te in the case of an n-channel device and Be or C in the case of a p-channel device are incorporated into the barrier material 408. These dopants are physically separate (remote) from the quantum well but due to band bending in this structure provide free carriers to the quantum well channel 402 (FIG. 4c).

Figure 4D:
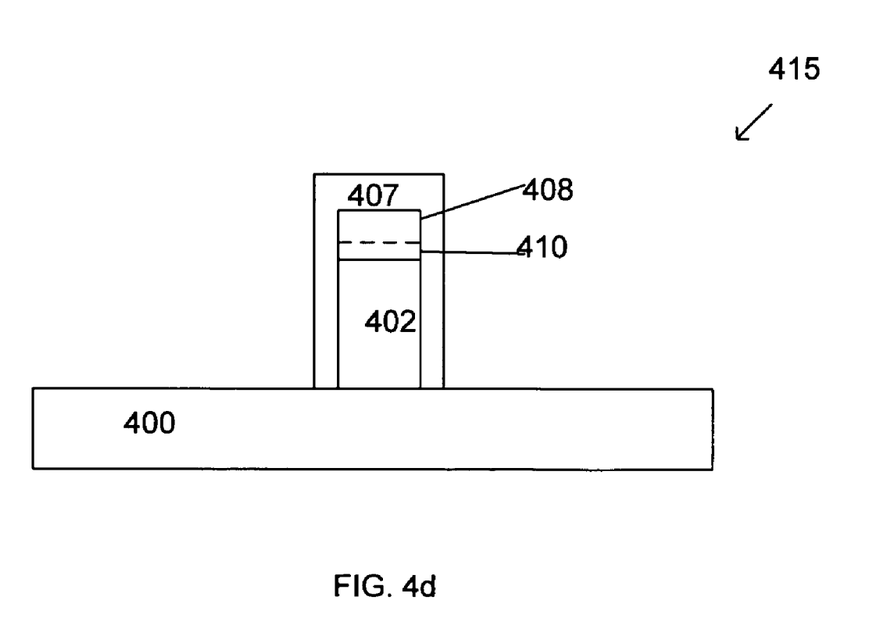

A high k dielectric 407 may be formed on the top barrier material 408 and on the sides of the fin 402 (FIG. 4d) to form the tri-gate structure 415, that may comprise a portion of a III-V tri-gate quantum well device. The delta doping of the tri-gate structure 415 improves the mobility of the device, and enables better contact resistance to quantum well 402 due to band bending thru the layer 408 as enabled by the delta doping layer 410. The quantum well tri-gate structure 415 with delta doping above the channel 402 may comprise a quantum well planar growth and ALD high-K formation without a need for technically difficult epitaxial growth on the sides of the III-V trigate quantum well channel 402. In an embodiment, the tri-gate structure 415 may further comprise a gate material and source/drain regions, similar to the tri-gate structure 315 of FIG. 3c, for example.

Figure 5A:
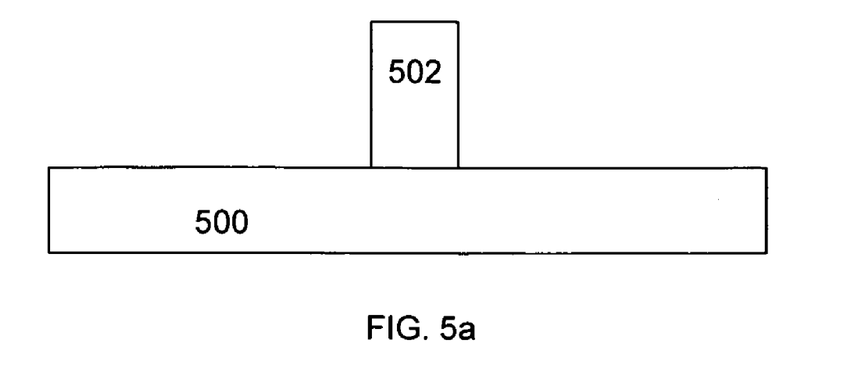
FIGS. 5a-5d represent methods of forming structures according to an embodiment.
Figure 5B:
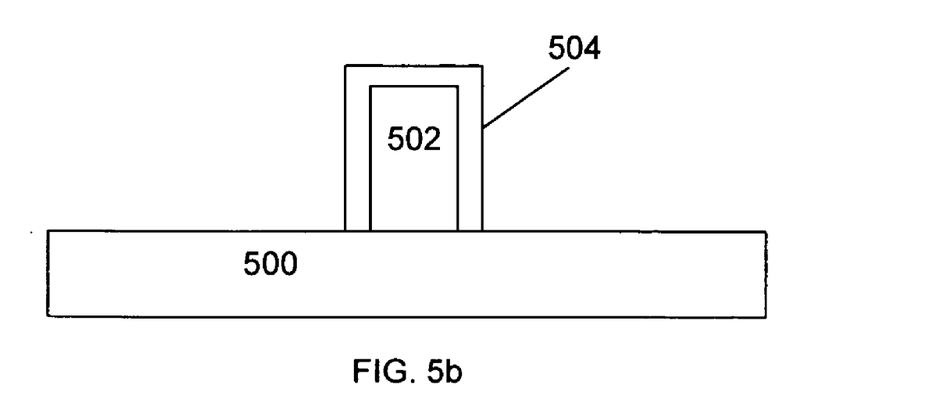

In another embodiment, a trigate fin 502 may be disposed on a substrate 500 (similar to the fin 202 and substrate 200 of FIG. 2a, for example) (FIG. 5a). The trigate fin 502 may comprise a channel of a tri-gate device, in an embodiment. A cladding material 504 may be formed on a top surface and on the sides of the fin/channel 502 (FIG. 5b). In an embodiment, the cladding material 504 may be formed according to a process similar to the processes depicted in FIGS. (1a-1g) disclosed previously herein. The cladding material 504 may comprise a material similar to the cladding material 104 of FIG. 1c, for example. In an embodiment, the cladding material 504 comprises a conformal cladding material layer around the tri-gate fin 502.

Figure 5C:
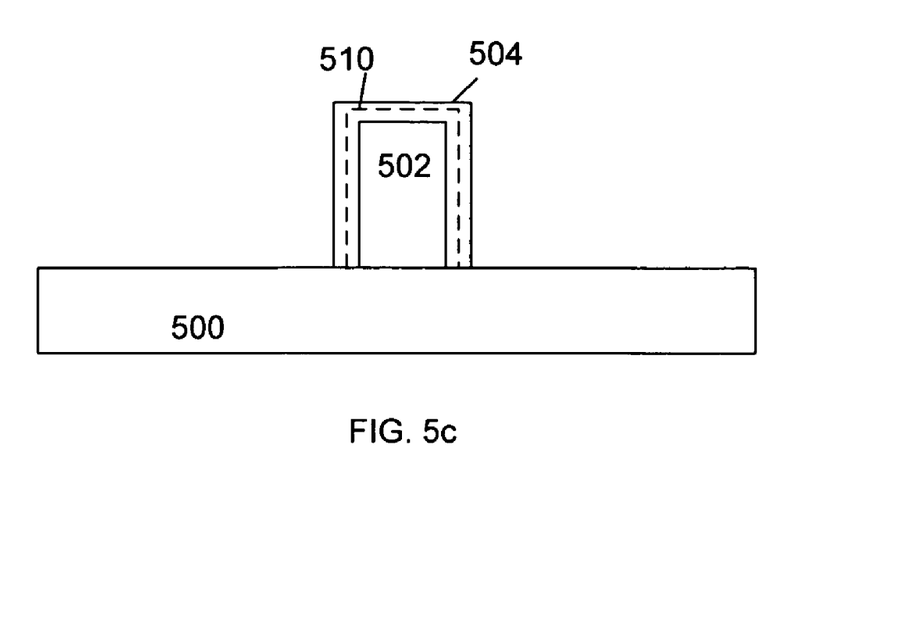

A portion 510 of the cladding material 504 may be delta doped, wherein monolayer of dopant atoms such as Si, S or Te in the case of n-channel devices and Be or C in the case of p-channel devices are incorporated in the cladding material 504. These dopants are physically separate (remote) from the quantum well but due to band bending in this structure, they provide free carriers to the quantum well device (FIG. 5c).

Figure 5D:
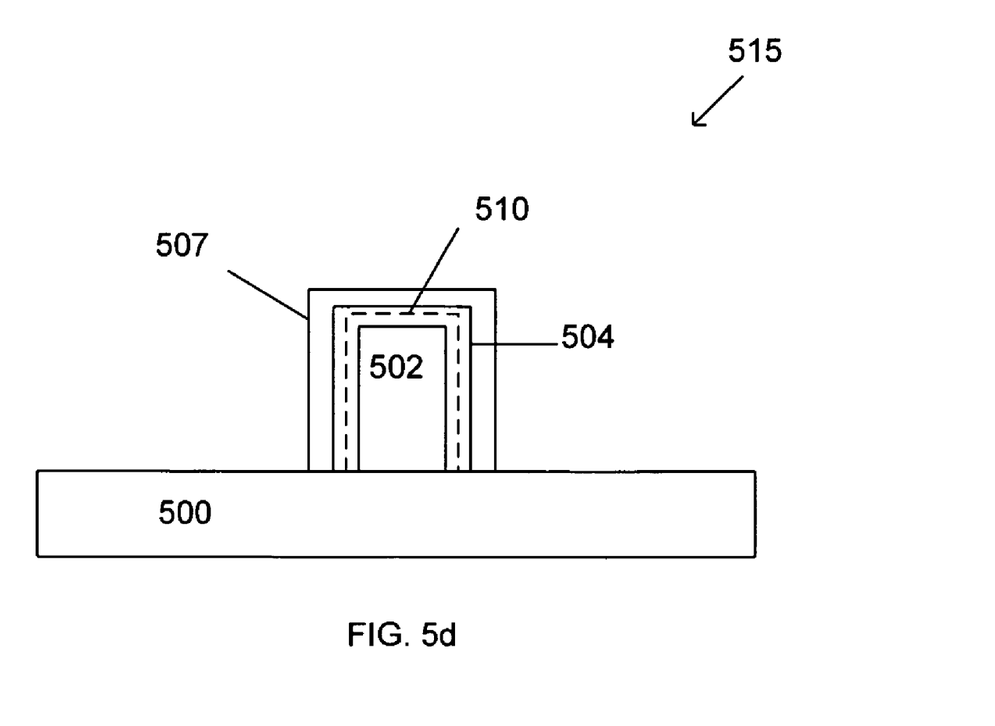

The portion 510 may comprise a top barrier/interfacial layer with delta doping 510 in some cases. A high k dielectric 507 may be formed on the delta doped cladding material 504 to form a tri-gate structure 515, and may comprise a high k gate dielectric 507 disposed on the tri-gate fin/channel(s) 502 (FIG. 5d). The tri-gate structure 515 may comprise a portion of a quantum well tri-gate device 515 with delta doping 510 surrounding the tri-gate channel 502. The tri-gate device 515 may comprise conformal re-growth of top barrier 510 and ALD high-K in some cases. The tri-gate structure 515 may increase to the mobility and performance and reduce the Rc of the to max speed and performance of the tri-gate device. In an embodiment, the tri-gate structure 515 may further comprise a gate material and source/drain regions, similar to the trigate structure 315 of FIG. 3c, for example.

Figure 6A:
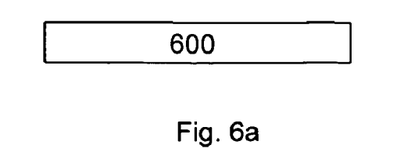
FIGS. 6a-6g represent methods of forming structures according to an embodiment.
Figure 6B:
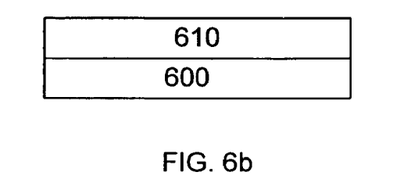

FIG. 6a depicts a first substrate 600. The first substrate may comprise any type of substrate that may support a nanowire structure. In an embodiment, the second substrate 600 may comprise an InP material, but may comprise other materials such as but not limited to AlInAs, AlInSb, AlGaAs. A first nanowire layer 610 may be formed/placed on the first substrate 600 (FIG. 6b). The first nanowire layer 610 may comprise a gate/all around tri-gate channel. In an embodiment, the first nanowire layer may comprise a III-V material, such as but not limited to InGaAs, InSb, InAs, GaAs, for example. In an embodiment, the first substrate 600 may be lattice matched with the first nanowire 610, yet may be chemically different than the first nanowire layer 610.

Figure 6C:
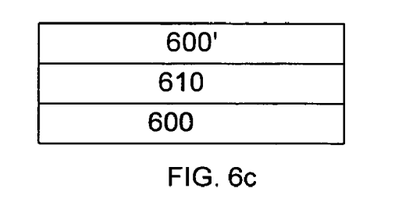
Figure 6D:
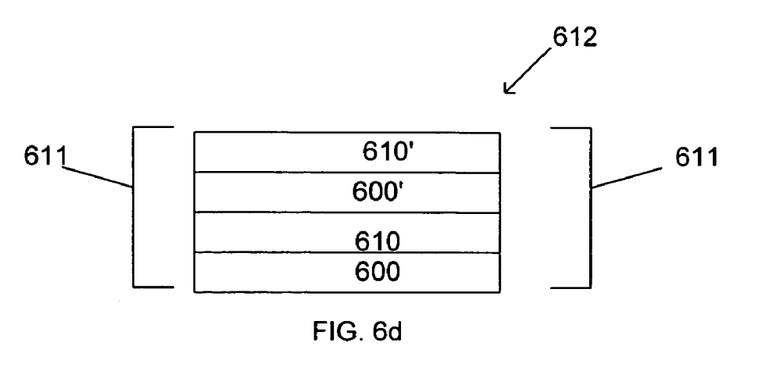

A second substrate 600' may be formed/placed on the first nanowire layer 610 (FIG. 6c). In an embodiment, the second substrate 600 may comprise an InP material, but may comprise other materials AlInAs, AlInSb, AlGaAs. A second nanowire layer 610' may be placed/formed on the second substrate 600' (FIG. 6d). In an embodiment, the second substrate 600' may be lattice matched with the second nanowire 610' yet may be chemically different than the second nanowire layer 610. In an embodiment, the second nanowire layer may comprise a III-V material, such as but not limited to InGaAs, InSb, InAs, GaAs, for example. The stacked substrates/channels 600, 610, 600', 610' may comprise side portions 611. In some embodiments, more than two sets of stacked substrates/channels may be stacked upon each other to form a stacked structure 612 comprising any number of channels, according to the particular design requirements.

Figure 6E:
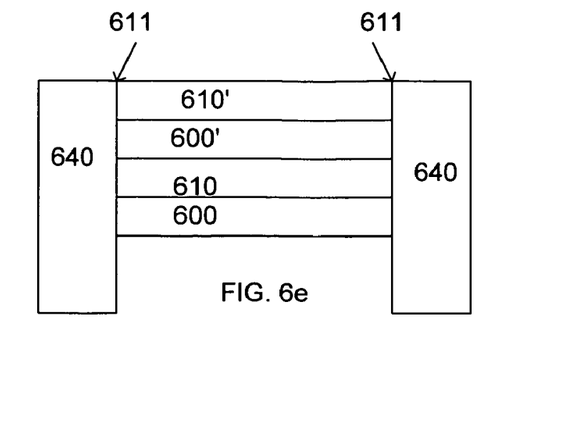
Figure 6F:
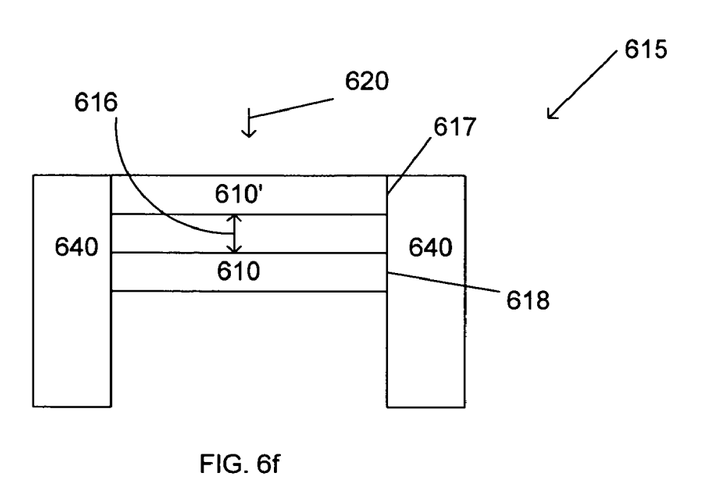

Source/drain regions 640 may be formed on the side portions 611 of the stacked channels/substrates 600, 610, 600', 610' (FIG. 6e). The substrates 600, 600' may be removed from the stacked substrate channels 600, 610, 600', 610' through a selective etching process 620 (FIG. 6f) to form a stacked channel tri-gate structure 615. In an embodiment, the stacked channel tri-gate structure may comprise a portion of a quantum well device. In an embodiment, a gap 616 separates the first nanowire channel 610 and the second nanowire channel 610', and the source/drain regions 640 are disposed on side portions 618, 617 of the first nanowire channel 610 and the second nanowire channel 610'. Chemistries may be chosen that may undercut and generate the stacked tri-gate structure 615. The channel fins 610, 610' may be anchored to the source/drain regions 640, while the substrates 600, 600' may be selectively etched out from the sides of the suspended structure.

Figure 6G:
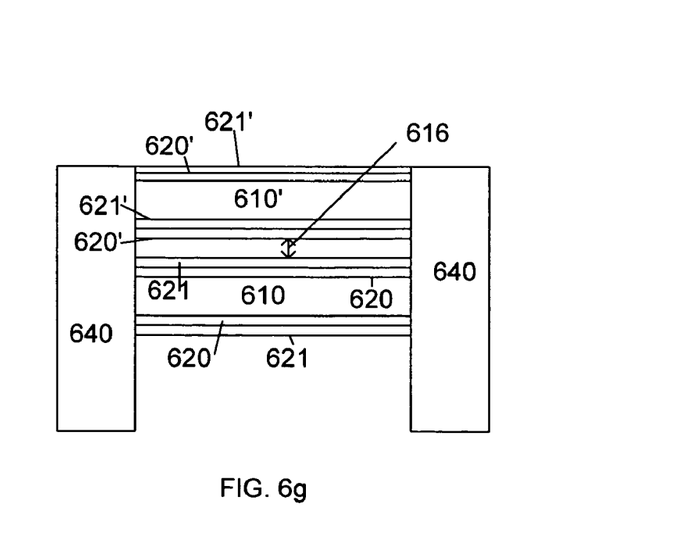

The channel structures 610, 610' possess improved scalability, and stacking several channels in a vertical structure increases the current per unit design footprint. Because of III-V high mobility/lower Rext, the stacked tri-gate structure 615 increases access to more channels than in prior art tri-gate structures, such as silicon based structures. In another embodiment, a first cladding layer 620 and a second cladding layer 620' may be formed on the first and second channels 610, 610' respectively, and a first high k dielectric gate material 621 and a second high k dielectric material 621' may be formed on the first and second cladding layers 620, 620' respectively, of the stacked tri-gate structure 615 (FIG. 6g). The cladding layers and high k dielectric layers may be formed around the channels 610, 610' (depicted as disposed on top and bottom surfaces of the channels 610, 610' in FIG. 6g).

Figure 7:
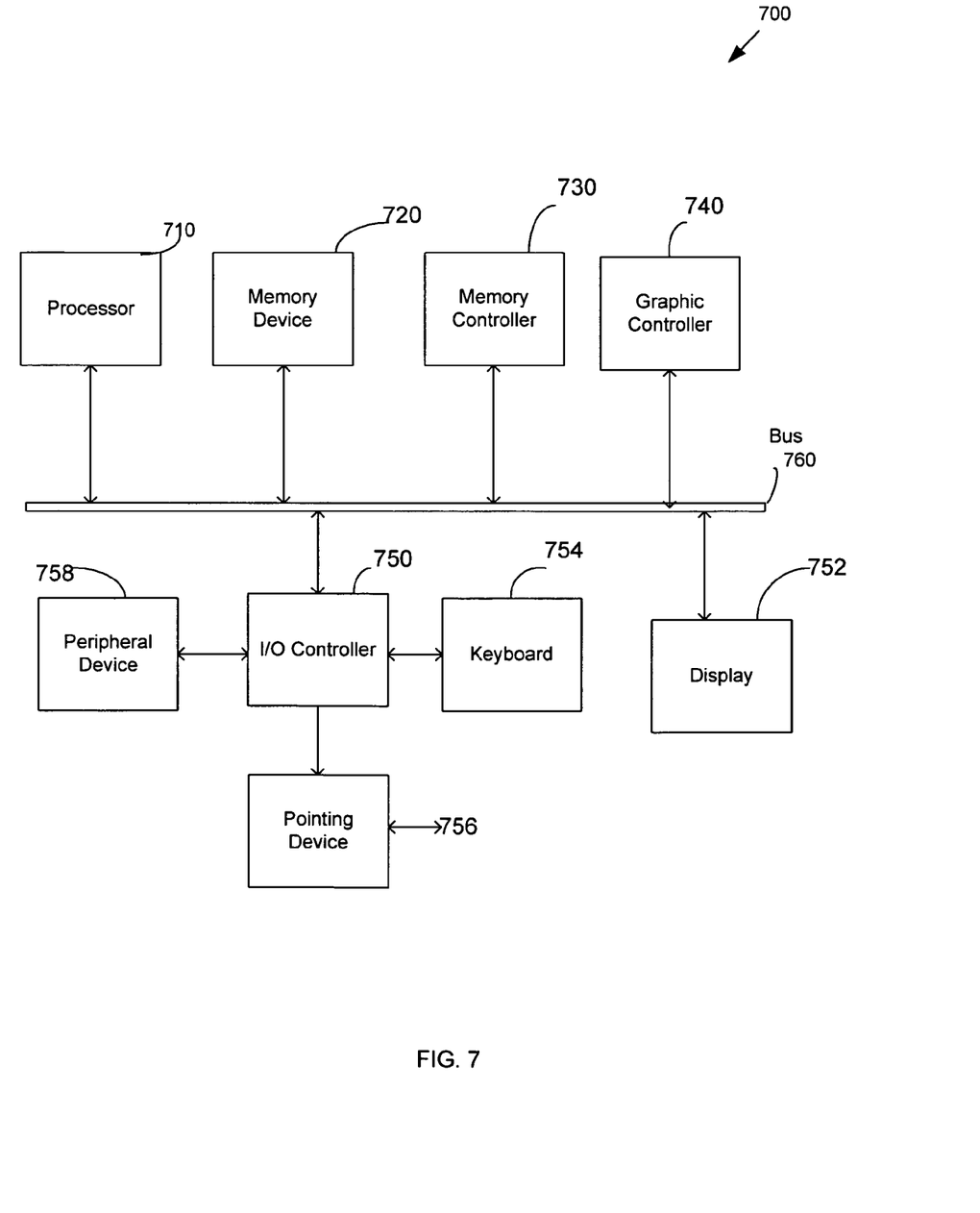
FIG. 7 represents a system according to an embodiment.

FIG. 7 shows a computer system according to an embodiment. System 700 includes a processor 710, a memory device 720, a memory controller 730, a graphics controller 740, an input and output (I/O) controller 750, a display 752, a keyboard 754, a pointing device 756, and a peripheral device 758, all of which may be communicatively coupled to each other through a bus 760, in some embodiments. Processor 710 may be a general purpose processor or an application specific integrated circuit (ASIC). I/O controller 750 may include a communication module for wired or wireless communication. Memory device 720 may be a dynamic random access memory (DRAM) device, a static random access memory (SRAM) device, a flash memory device, or a combination of these memory devices. Thus, in some embodiments, memory device 720 in system 700 does not have to include a DRAM device.

One or more of the components shown in system 700 may include one or more tri-gate devices of the various embodiments included herein. For example, processor 710, or memory device 720, or at least a portion of I/O controller 750, or a combination of these components may include in an integrated circuit package that includes at least one embodiment of the structures herein.

These elements perform their conventional functions well known in the art. In particular, memory device 720 may be used in some cases to provide long-term storage for the executable instructions for a method for forming structures in accordance with some embodiments, and in other embodiments may be used to store on a shorter term basis the executable instructions of a method for forming structures in accordance with embodiments during execution by processor 710. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, memory device 720 may supply the processor 710 with the executable instructions for execution.

System 700 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Benefits of the embodiments included herein include the enablement of quantum well III-V tri-gate technology. The embodiments enable high mobility, EOT scaling, Rext reduction, improved scaleability for both Ioff control and pitch/density scaling and enabling of high performance, high mobility devices.

Although the foregoing description has specified certain steps and materials that may be used in the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, it is appreciated that various microelectronic structures, such as transistor devices, are well known in the art. Therefore, the Figures provided herein illustrate only portions of an exemplary microelectronic structure that pertains to the practice of the embodiments. Thus the embodiments are not limited to the structures described herein.

What is claimed is:

1. A method comprising:
    forming a III-V material fin on a substrate;
    forming a triangular cladding material on the III-V material fin;
    forming an oxide on the triangular cladding material; and
    forming a rectangular cladding material around the III-V material fin.

2. The method of claim 1 further comprising wherein the rectangular cladding material comprises a III-V cladding material disposed on a top surface and the sides of the III-V material fin.

3. The method of claim 1 wherein forming the rectangular cladding material comprises:
    forming a resist material on the oxide over the III-V material fin;
    etching the cladding material; and
    removing the resist.

4. The method of claim 1 further comprising wherein the III-V material fin comprises a III-V tri-gate channel of a quantum well device.

5. The method of claim 4 further comprising forming a high k dielectric on the rectangular cladding material, wherein the high k dielectric comprises a hi k gate dielectric.

6. A method comprising:
    forming a III-V tri-gate fin on a substrate;
    forming a triangular cladding layer around the III-V tri-gate fin;
    forming a hi k gate dielectric around the triangular cladding layer; and
forming a rectangular cladding material around the III-V material fin.

* * * * *